(12) United States Patent
Haba et al.

(10) Patent No.: US 9,947,633 B2
(45) Date of Patent: Apr. 17, 2018

(54) DEFORMABLE CONDUCTIVE CONTACTS

(71) Applicant: Invensas Corporation, San Jose, CA (US)

(72) Inventors: Belgacem Haba, Saratoga, CA (US); Thomas DiStefano, Monte Sereno, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/195,617

(22) Filed: Jun. 28, 2016

(65) Prior Publication Data

US 2017/0373033 A1    Dec. 28, 2017

(51) Int. Cl.
*H01L 23/48*    (2006.01)
*H01L 23/00*    (2006.01)
*H01L 23/29*    (2006.01)

(52) U.S. Cl.
CPC ............ *H01L 24/14* (2013.01); *H01L 23/293* (2013.01); *H01L 24/09* (2013.01); *H01L 24/17* (2013.01); *H01L 24/81* (2013.01); *H01L 2224/13011* (2013.01); *H01L 2224/13016* (2013.01); *H01L 2224/14051* (2013.01); *H01L 2224/16057* (2013.01); *H01L 2224/17055* (2013.01); *H01L 2224/81345* (2013.01)

(58) Field of Classification Search
None
See application file for complete search history.

(56) References Cited

U.S. PATENT DOCUMENTS 5,414,298 A * 5/1995 Grube .................... H01L 24/72
                                                    257/690
7,435,108 B1 * 10/2008 Eldridge ............ G01R 1/06727
                                                    439/66

\* cited by examiner

*Primary Examiner* — Cory Eskridge

(57) ABSTRACT

Deformable conductive contacts are provided. A plurality of deformable contacts on a first substrate may be joined to a plurality of conductive pads on a second substrate during die level or wafer level assembly of microelectronics. Each deformable contact complies to a degree that is related to the amount of joining pressure between the first substrate and the second substrate. Since an individual contact can make the conductive coupling within a range of distances from a target pad, an array of the deformable contacts provides tolerance and compliance when there is some variation in height of the conductive elements on either side of the join. A flowable underfill may be provided to press the deformable contacts against opposing pads and to permanently join the surfaces at a fixed distance. The deformable contacts may include a wiping feature to clear their target pads for establishing improved metal-to-metal contact or a thermocompression bond.

20 Claims, 9 Drawing Sheets

DEFORMABLE CONDUCTIVE CONTACTS

BACKGROUND

Substrates or surfaces in 3D integrated circuit production or in electronic assembly in general may have arrays of electrical contacts, bonding pads, or grid arrays to be conductively joined to corresponding electrical contacts on a second substrate or surface. Uniformity in the contacts may not always be perfect. Conventionally, if a single electrical contact is too short or too tall, there is often no leeway in the joining of the two surfaces to allow the short contact to meet its target bonding pad, or to prevent a tall contact from preventing the bonding of nearby contacts. This is because conventional contacts are all assumed to be ideal, and dielectric layers present between surfaces to be joined are calculated to provide an unvarying stop in the joining of the two surfaces at a definite, single, fixed distance. This lack of compliance in conventional die or wafer level joining processes results in a certain percentage of the final product being unacceptable, as there may be some electrical contacts that did not connect during the joining.

SUMMARY

Deformable conductive contacts are provided. A plurality of compliant, deformable contacts on a first surface or substrate may be joined to a plurality of conductive pads on a second surface or substrate. Each compliant deformable contact deforms to a degree that is related to the amount of joining pressure between the first substrate and the second substrate, when making the conductive coupling. Since an individual contact can make the conductive coupling within a range of distances from its target bond pad, an array of the deformable contacts provides tolerance and compliance when there is some inevitable variation in height of the conductive elements on either side of the join. A flowable underfill may be provided to press the deformable contacts against opposing pads and to permanently join the surfaces at a fixed distance. The deformable contacts may include a wiping feature to clear the target pads for establishing a thermocompression bond or at least improved metal-to-metal contact, and may be annealed to target pads or provided with a layer of solder, to secure the conductive coupling.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes deformable conductive contacts. The systems and methods described herein may be applied to the joining together of numerous types of substrates or surfaces that have multiple electrical connections to be made across two surfaces, when joining the two surfaces together. Substrate is used broadly herein to mean a surface of an electronic device or material. The surfaces being joined may be surfaces of dies, wafers, substrates, and so forth, as used in microelectronics. Substrates may be composed of a semiconductor, but may also be composed of glasses, plastics, and many other materials. "Joining" means bringing together, and can include permanent joining by an intermediate adhesive, layer, solder, or device, for example. The deformable conductive contacts and supporting underfill material described herein provide compliant die, wafer, substrate, device, and package assembly that can tolerate some variation in the conductors being joined, while providing consistent electrical paths between two surfaces or substrates.

The deformable contacts may be used in die level processes, such as die-to-die processes, die-to-wafer processes, die-to-substrate processes, intermediate structure assembly, and so forth. The deformable contacts may also be used in a wafer level processes, or during wafer-to-wafer bonding, where the wafers are full monolithic semiconductor wafers or reconstituted wafers. Thus, the techniques described herein can be performed on dies or wafers, and can join dies, wafers, substrates, and the like during die level and wafer level processes. "Substrate" is used broadly herein to refer to any surface of a material or device used in the microelectronic arts.

The substrates or other surfaces to be joined may be composed of silicon or another semiconductor, III-V materials, glass, polymer, plastic, phenolic, epoxy, glass epoxy, printed circuit board, and so forth. Each surface to be joined has electrical conductors to be coupled with opposing electrical conductors on the second, opposing surface. The electrical conductors may be bonding pads of an integrated circuit, interconnects, connection points, through-silicon-vias, posts, bumps, printed circuits, grid arrays, or other conductive entities that can be conductively connected to from one surface to another surface during a join.

Example Systems

Figure 1:
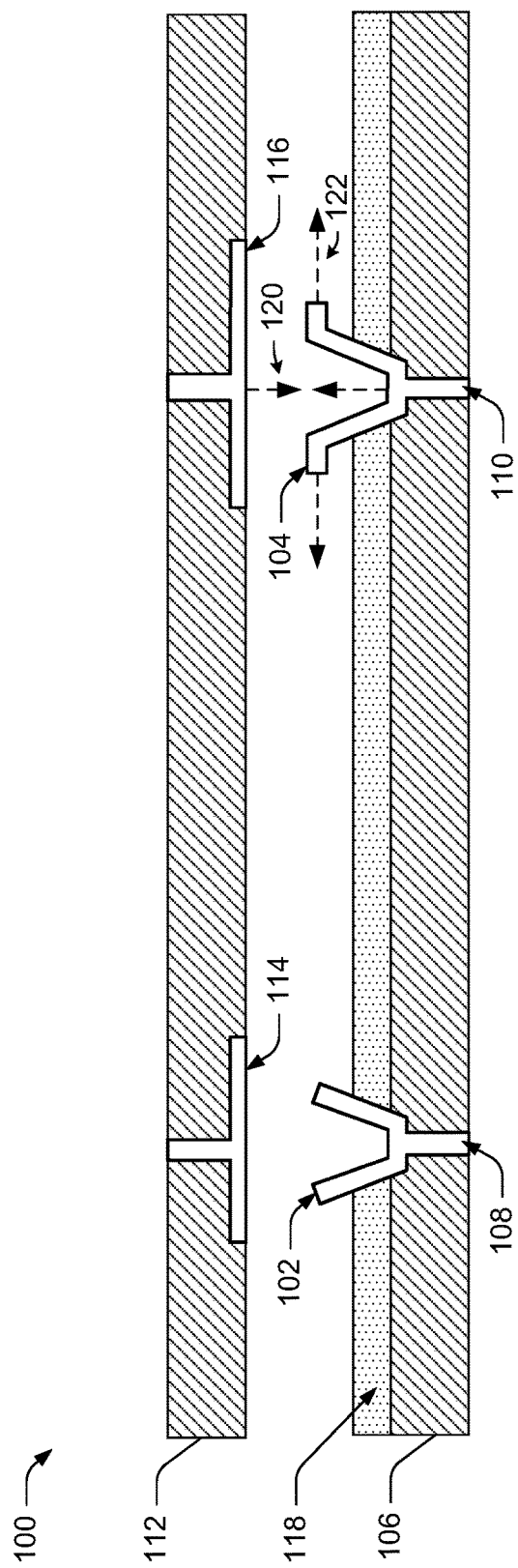
FIG. 1 is a diagram of an example system in which plurality of deformable contacts on a first substrate is joined to a plurality of conductive pads on a second substrate.

FIG. 1 shows an example system 100. Deformable Conductive contacts 102 & 104 are disposed on a first substrate 106 and conductively connected to respective electrical conductors 108 & 110 in the first substrate 106, such as parts of an integrated circuit, or through-silicon-vias. In an implementation, the example first substrate 106, which is to be joined to a second substrate 112, has a plurality of the deformable conductive contacts 102 & 104 (hereinafter, "deformable contacts"), one for each electrical connection to be made across the interface between the two substrates 106 & 112. Deformable, as used herein, means that the electrical contact 102 changes shape to comply with its electrical target. In an implementation, each deformable contact 102 & 104 expands open 122 against its respective target conductive pad 114 & 116 as the deformable contacts 102 & 104 compress 120 against the opposing target pads 114 & 116. Depending on style, the deformable contact 102 may expand 122 to conductively couple with the target pad 114 by curving, bending, warping, bulging, or hinging at an expanse, a bend, or a curve of its shape. Likewise, a deformable contact 102 may be made with leaf-like arms thin enough to bend along an expanse of their length to comply with the target pad 114 when forced up 120 against the target pad 114 by the joining forces applied.

An underfill material 118, such as a dielectric or a combination of materials, underlies or underflows the plurality of deformable contacts 102 & 104 and applies pressure to the contacts 102 & 104 to push the contacts 102 & 104 against target pads 114 & 116 on the opposing surface of the second substrate 112. The underfill material 118 around the deformable contacts 102 & 104 also determines the relative stiffness or resilience of the contacts 102 & 104 against their corresponding target pads 114 & 116 on the opposing surface of the second substrate 112.

Figure 2:
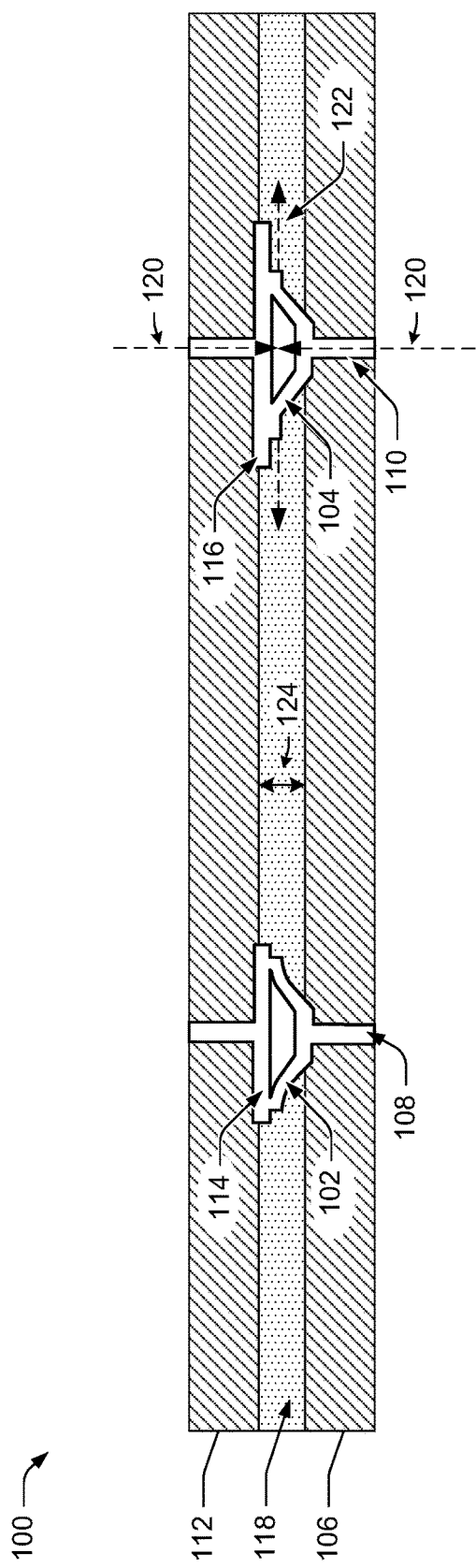
FIG. 2 is a diagram of an example joined state of the example system of FIG. 1.

FIG. 2 shows an example joined state of the example system 100. In an implementation, the underfill material 118 can also determine the greatest extent of deformation, shape-change, or compression 120 of each contact 102 & 104, and finally, determines the permanent distance 124 between the two joined surfaces 106 & 112, because the underfill material 118 ultimately provides an incompressible stop to the joining action. The underfill material 118 may also cool or harden to hold, adhere, or cement the joined surfaces 106 & 112 together.

Each deformable contact 102 & 104 independently complies with its respective target conductive pad 114 & 116, individually complying 120, for example spreading open 122, to a degree dictated by the individual distance between contact 102 and respective target pad 114, as needed to make a favorable conductive coupling. Numerous deformable contacts 102 & 104, as a group or plurality, provide a compliant system 100 for making successful conductive couplings across numerous electrical contacts 102 & 104, including contacts that may not be perfect, and contacts that may not be at an expected height.

An example system 100, therefore, may have a plurality of deformable contacts 102 & 104 on a first substrate 106, a plurality of conductive pads 114 & 116 on a second substrate 112, each deformable contact 102 & 104 capable of conductively coupling with a corresponding conductive pad 114 & 116 when the first substrate 106 is joined to the second substrate 112. Each deformable contact 102 & 104 is configured to comply, such as spread open 122, in relation to a degree of compression 120 against each corresponding conductive pad 114 & 116. At least one underfill material 118 is disposed between the first substrate 106 and the second substrate 112 to actuate each deformable contact 102 & 104 against each corresponding conductive pad 114 & 116 and to determine a closest proximity 124 of the first substrate 106 to the second substrate 112.

Figure 3:
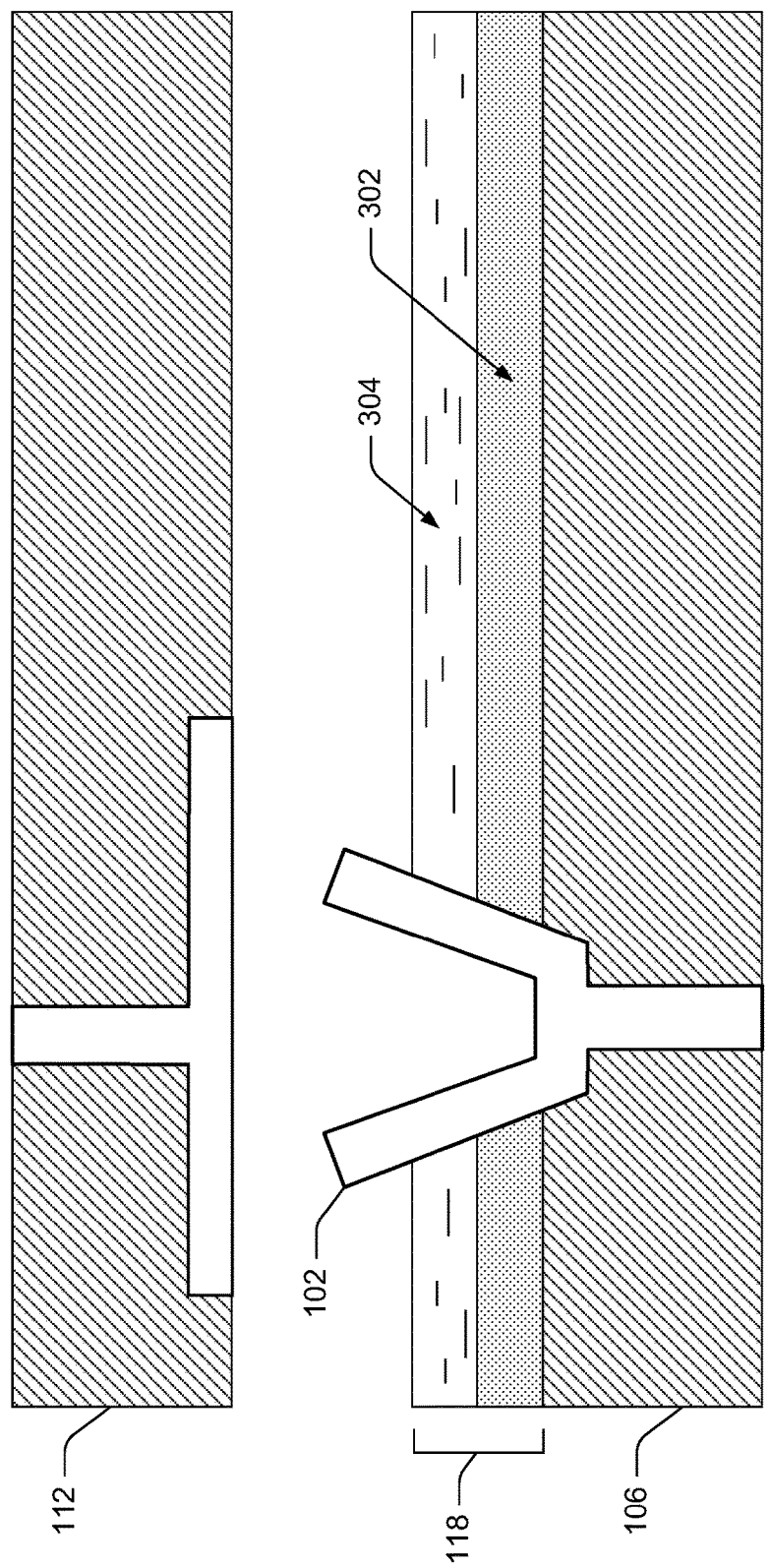
FIG. 3 is a diagram of an example underfill material having a combination of components, multiple layers, or a mixture of different materials.

As shown in FIG. 3, an example underfill material 118 may have a combination of components, such as multiple layers, or may be a mixture of different materials. In various implementations, the at least one underfill material 118 may be a first solid underfill material 302 together with a second flowable (liquid or malleable) 304 underfill material 118. The underfill material 118 may be a dielectric, for example a single solid dielectric or a single flowable dielectric. Or, the underfill material 118 may be composed of both a solid dielectric 302 and a flowable dielectric 304. Or yet again, the example underfill material 118 may be a mixture or multi-layer combination of other solid polymers 302 and flowable polymers 304. In an implementation, the underfill material 118 is a solid or flowable thermoplastic polyimide (TPI).

In an implementation, the at least one underfill material 118 is disposed on the first substrate 106. In another implementation, the underfill material 118 may be initially disposed instead on the second substrate 112. In yet another implementation, the underfill material 118 may be disposed on both the first substrate 106 and the second substrate 112 before the first substrate 106 is joined to the second substrate 112. As introduced above, the underfill material 118 or combination of underfill materials 118 may cool or harden to permanently join the first substrate 106 to the second substrate 112 at a fixed distance 124 from each other.

Example Deformable Conductive Contacts

Figure 4:
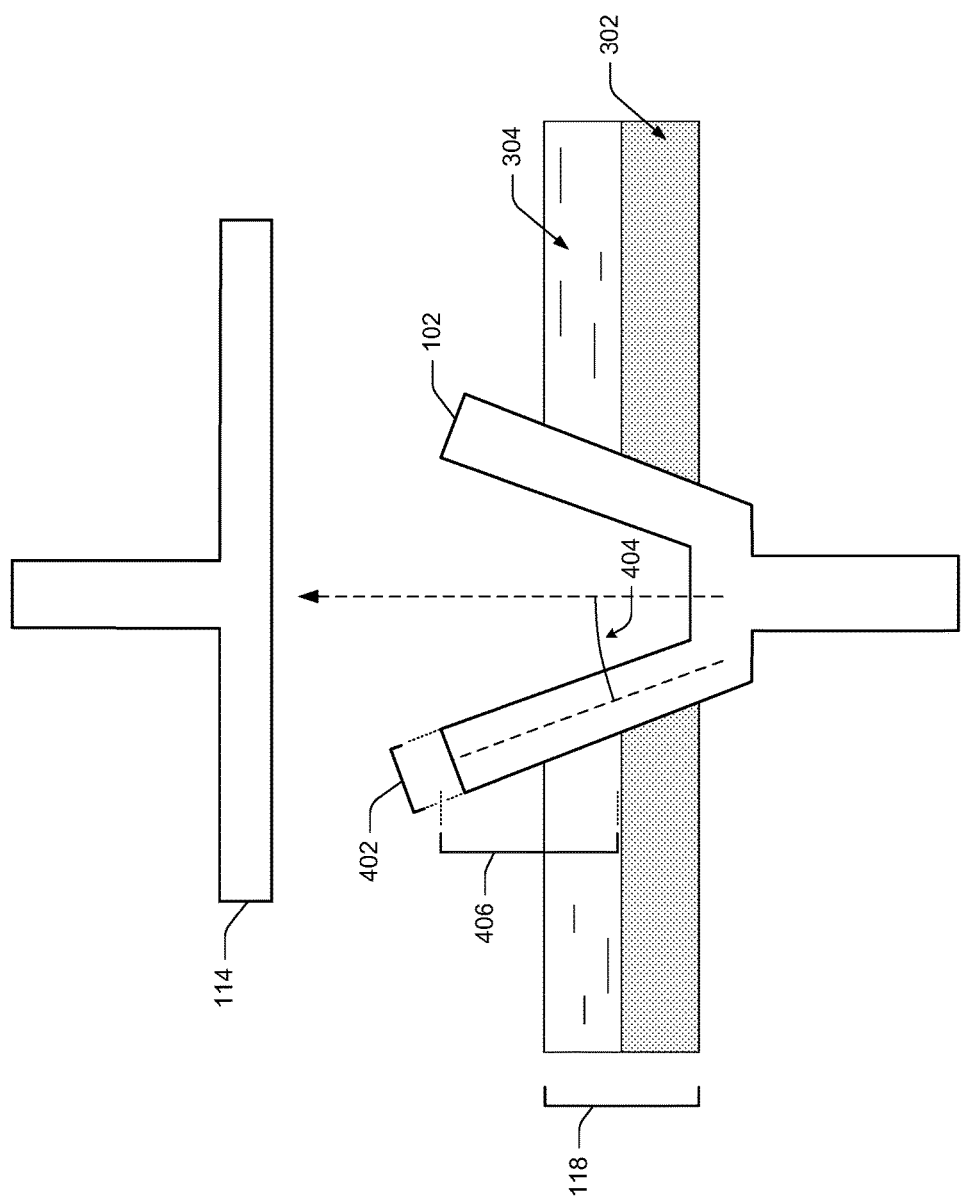
FIG. 4 is a diagram of example geometric features of an example deformable conductive contact.

FIG. 4 shows an example deformable conductive contact 102 and an opposing target conductive pad 114. The target conductive pad 114, although shown as flat, can be other various designs, such as concave, convex, ridged, or annular (ring-like). Moreover, the target conductive pad 114 may be flush with the surface of the second substrate 112, or protrude from the second substrate 112, or be recessed into the second substrate 112.

FIG. 4 shows a cross-sectional view of an implementation of the example deformable conductive contact 102 as a truncated cone. The deformable conductive contact 102, however, may be implemented in many different designs, styles, and geometries. For example, the deformable contact 102 may be implemented as a leaf of conductive material, a leaf spring, a spring, a flexible cup, a bendable finger of conductive material, a curved member, a folded member, a bent member, a 3-leaf or 4-leaf clover or cloverleaf shaped member, a v-shaped member, a v-shaped member with wings, a u-shaped member, an L-shaped member, and a y-shaped member, or the truncated cone shown in FIG. 4, for example.

Example deformable conductive contacts 102 can be made from many conductive materials used in the electronics industries. Example construction materials include copper alloys, copper, bronze, phosphor bronze, steel, titanium, silver, silver tungsten, silver tungsten carbide, copper tungsten, silver graphite, silver tungsten carbide graphite, silver molybdenum, silver nickel, copper graphite, tantalum, conductive polymers, and other conductive materials.

The deformable conductive contact 102 can be implemented in many different sizes, such as relatively large sizes for joining printed circuit boards with discrete components, the deformable conductive contact 102 measured in millimeters, down to very small contacts 102 measured in micron sizes for fine pitch circuits, leads, and traces at the finer level of assembling, stacking, and packaging wafers, chips, dies, and interconnects during die level and wafer level processes.

As shown in FIG. 4, the thickness 402 (not shown to scale) and geometry of the deformable contact 102 as well as the properties of the material used, the angle of slant 404 from the vertical direction of the joining forces, and the height 406 of the expandable part of the deformable contact 102 above solid layers 302 of the underfill material 118 can be selected to define the force needed for compliance of an individual deformable contact 102. Thus, the number of individual deformable contacts 102 that are present in the plurality of contacts 102 on a substrate 106 determines the total joining force needed for compliance of the plurality of deformable contacts 102 when joining the substrate 106 to a second substrate 112.

Example Wiping and Bonding Functions

In an implementation, the shape or design of the deformable contact 102 can interact against and across the surface of the target conductive pad 114 to provide the conductive contact or bond. For example, expansion 122 or an opening deformation of the deformable contact 102 across the pad 114 may cause a wiping motion on the target conductive pad 114, enhancing the conductive coupling with the pad 114.

Figure 5:
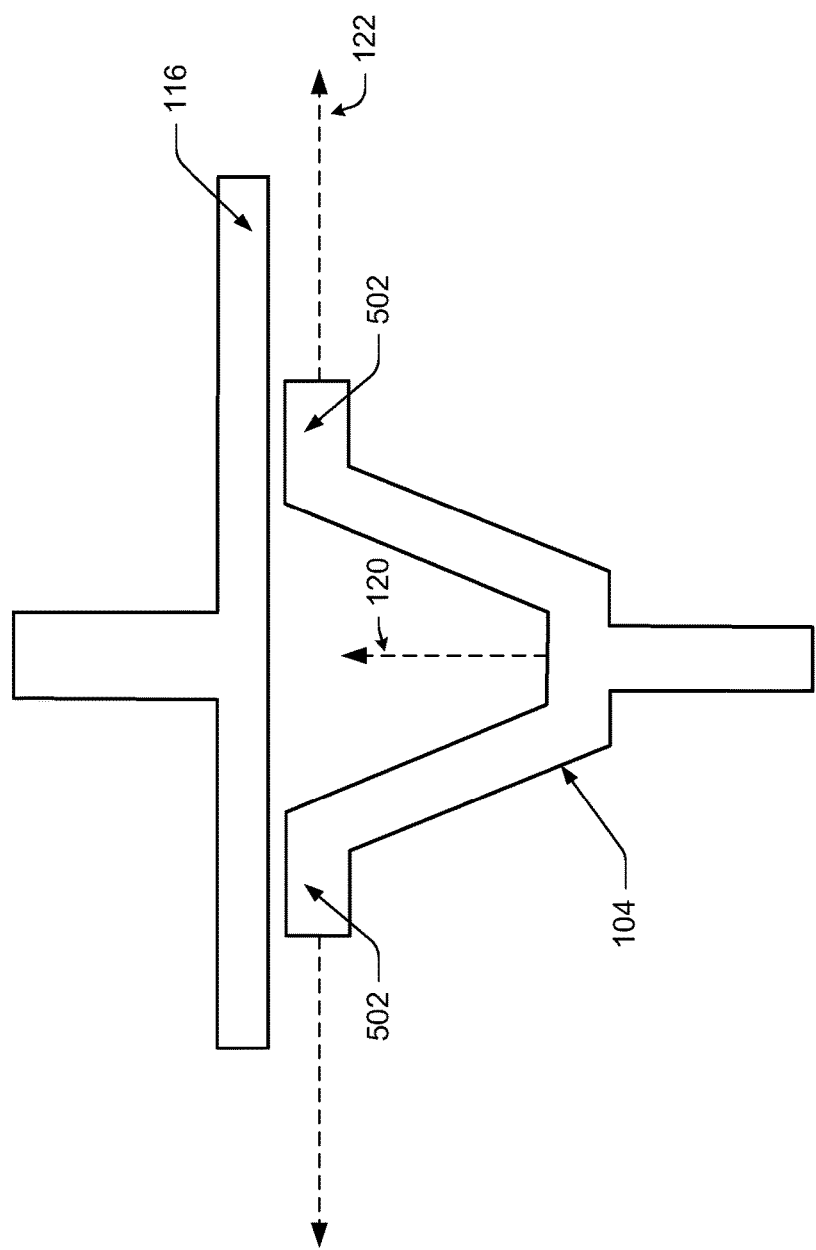
FIG. 5 is a diagram of an example deformable conductive contact with wings.

FIG. 5 shows an implementation of the deformable contact 102 that also has one or more wings 502, such as accessory appendages to facilitate electrical contact or physical performance. The wings 502 may be stabilizing members to keep the deformable contact 102 aligned during compression, and may be conductive members added to increase conductive surface area contact with the target pad 114, and may be wiping members to increase the above-mentioned wiping effect. Whether a deformable contact 102 has wings 502 or not, the deformable contact 102 may compress, morph, change shape, or deform 120 in the direction of the joining motion, and may expand 122 or spread open in one or more directions perpendicular or normal to the direction of the joining motion to perform the wiping motion of the target pad 114.

The deformable contact 102, wing 502, or other wiping member may perform a cleaning or scraping action across the target conductive pad 114, clearing a nonconductive film or oxide layer from the target pad 114 and also from itself, to make a more definite metal-to-metal electrical contact between members.

The joining pressure applied may cause the deformable contact 102 or an associated wiping member, a wing 502, for example, to cold-weld to the target pad 114 or second conductor. The metal-to-metal interface between the deformable contact 102 and the target conductive pad 114 may form a thermocompression bond or otherwise become a conductive coupling that has a metal-to-metal bond zone with no distinguishable boundary between a first metal of the deformable contact 102 (or wiping member 502), and a second metal of the target pad 114. To form such a metal diffusion bond, the two substrates 106 & 112 are brought together with a pressure and at a temperature sufficient for the conductive metal of the deformable contact 102 and the target pad 114 to meld into each other by atomic diffusion at the interface, which becomes a solid crystalline bond zone.

In an implementation, the deformable contact 102 is capable of annealing or sintering to the target conductive pad 114 or second conductor at a raised temperature, or with an application of ultrasound, or with both the raised temperature and the application of ultrasound during the joining. In an implementation, the same raised temperature and application of ultrasound may also cure or harden the underfill material 118 to complete the join between the two surfaces 106 & 112.

A geometry of the wings 502 may be selected to increase the surface area of the wings 502 and provide an increased area of surface contact between the wings 502 and the target pad 114 compared to the amount of area of surface contact that the deformable contact 102 alone would have with the target pad 114. The increased surface contact area of the wings 502 increases the conductive wingspan of the deformable contact 102 and can enable the deformable contact 102 to make contact with the target conductive pad 114 even when the deformable contact 102 is slightly misaligned with respect to the target pad 114.

Additional Implementations and Features

Figure 6:
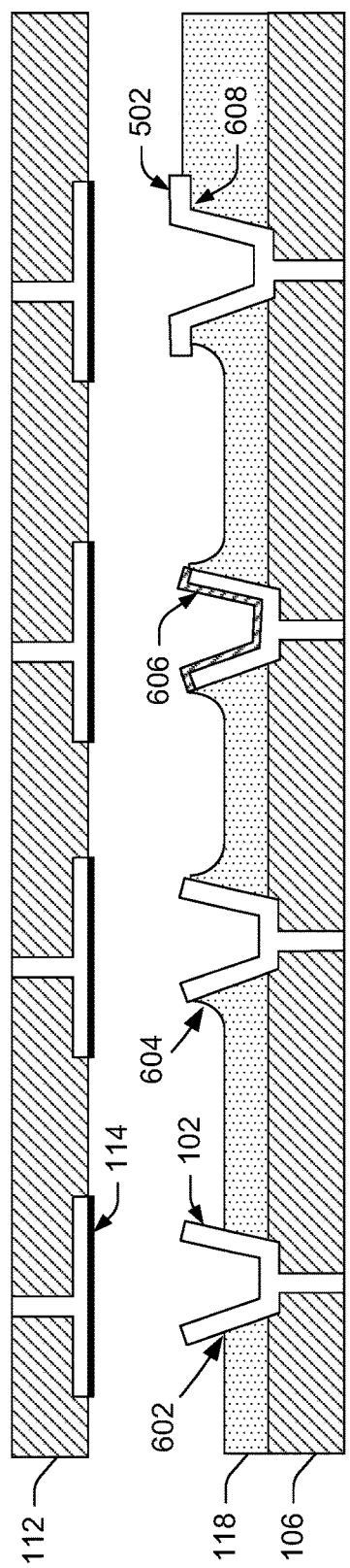
FIG. 6 is a diagram of additional implementations of the example deformable conductive contact and the example underfill material.

FIG. 6 shows additional implementations of the deformable contact 102 and the underfill material 118. The implementations shown in FIG. 6 do not necessarily occur on the same substrate 106, although two or more of the implementations can be used together on the same substrate 106 in some circumstances.

The underfill material 118 may be placed to form one or more layers up to a select level 602 of the deformable contact 102. The support provided by the underfill material 118 up to the level 602 of initial fill can determine the deformability, compressibility, spreadability, or springiness of the deformable contact 102.

A lip, collar, or slope 604 of the underfill material 118 may taper up to the contact edge of the deformable contact 102. This slope 604 of polymer or other underfill material 118 can further stiffen or strengthen the compressibility and openability of the deformable contact 102. The lip or slope 604 of underfill material 118 can increase the amount of joining pressure needed over a plurality of the deformable contacts 102 on a substrate, to compress and spread open the plurality. However, the benefit of increasing the amount of joining pressure needed, by having the lip or slope 604, is that each deformable contact 102 presses against the corresponding target pad 114 with more force when the lip or slope 604 is present. This prevents a deformation, compression, or spreading open of the deformable contact 102 from occurring with too little pressure, which might compromise the quality of the conductive coupling.

An oxidation protectant 606 may be added to the conductive contact surfaces of the deformable contact 102. The oxidation protectant 606 may depend on the constitution of the deformable contact 102, such as which metal, alloy, or other conductive material is used to make up the deformable contact 102. In an implementation, a thin layer or film of gold, platinum, or another noble or inert metal may be deposited, plated, or sputtered onto the contact surfaces of the deformable contact 102 and/or the target pads 114 to ensure a high quality of the metal-to-metal contact or thermocompression bond, and a high quality of the conductive coupling.

In an implementation, the underfill material 118, such as a dielectric or other polymer, may be initially deposited to near the top 608, the contact edge, or the wings 502 of the deformable contact 102. In this scenario, in its initial pre-joined state, the underfill material 118 has no undercut below an overhang of the wings 502, for example. In this implementation 608, the underfill material 118 may press the contact surface area of the wings 502, for example, directly into the target pad 114, supported and backed directly by the underfill material 118 with little or no allowance for the springiness or deformability of the conductive contact 102 to create coupling pressure. However, a flowable underfill material 118 may be used, at least in part, so that as the underfill material 118 complies under the forces of joining, the individual deformable contacts 102 are then able to comply individually, if some of the deformable contacts 102 are shorter or taller than others with respect to their target pads 114. In other words, the space between the first substrate 106 and the second substrate 112 may begin relatively full of the underfill material 118, but as the underfill material 118 melts or flows, each individual deformable contact 102 is able to make firm conductive contact with respective target pads 114, with some support of the underfill material 118 the entire time.

Figure 7:
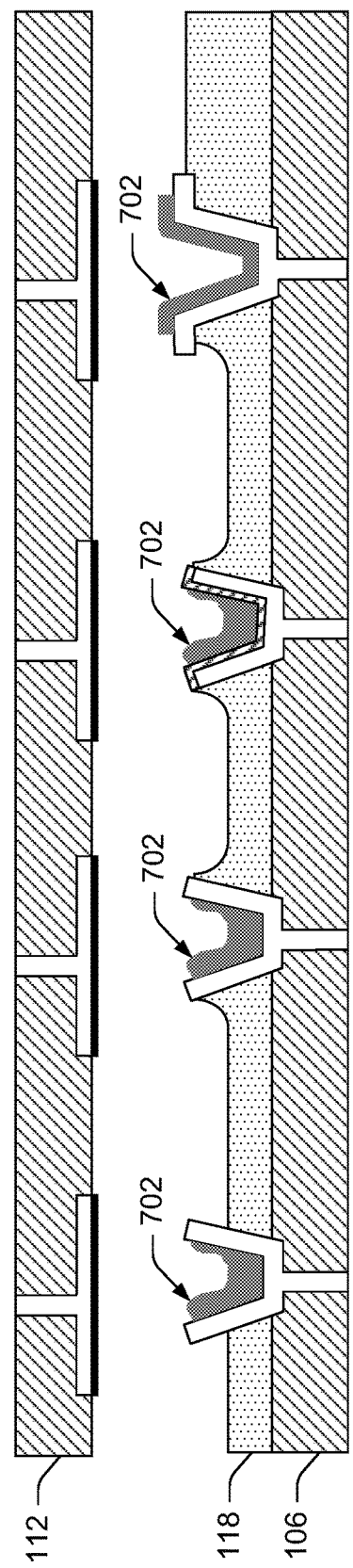
FIG. 7 is a diagram of example implementations of the example deformable conductive contact with a film or layer of solder.

FIG. 7 shows a film or layer of solder 702 or other bonding or alloying agent added to each implementation of the deformable contact 102 shown in FIG. 6. The solder 702 can be made flowable at raised temperatures, for example at temperatures in the range of 183-350° C., to secure the conductive bond in each conducting couple. The raised temperature for fusing the solder 702 may be in the same temperature range as applied to make the underfill material 118 flowable. In an implementation, upon cooling, the entire joined package cures and hardens into solidly joined substrates 106 & 112 with solidly soldered conductive couplings between the plurality of deformable contacts 102 and the plurality of conductive target pads 114.

Figure 8:
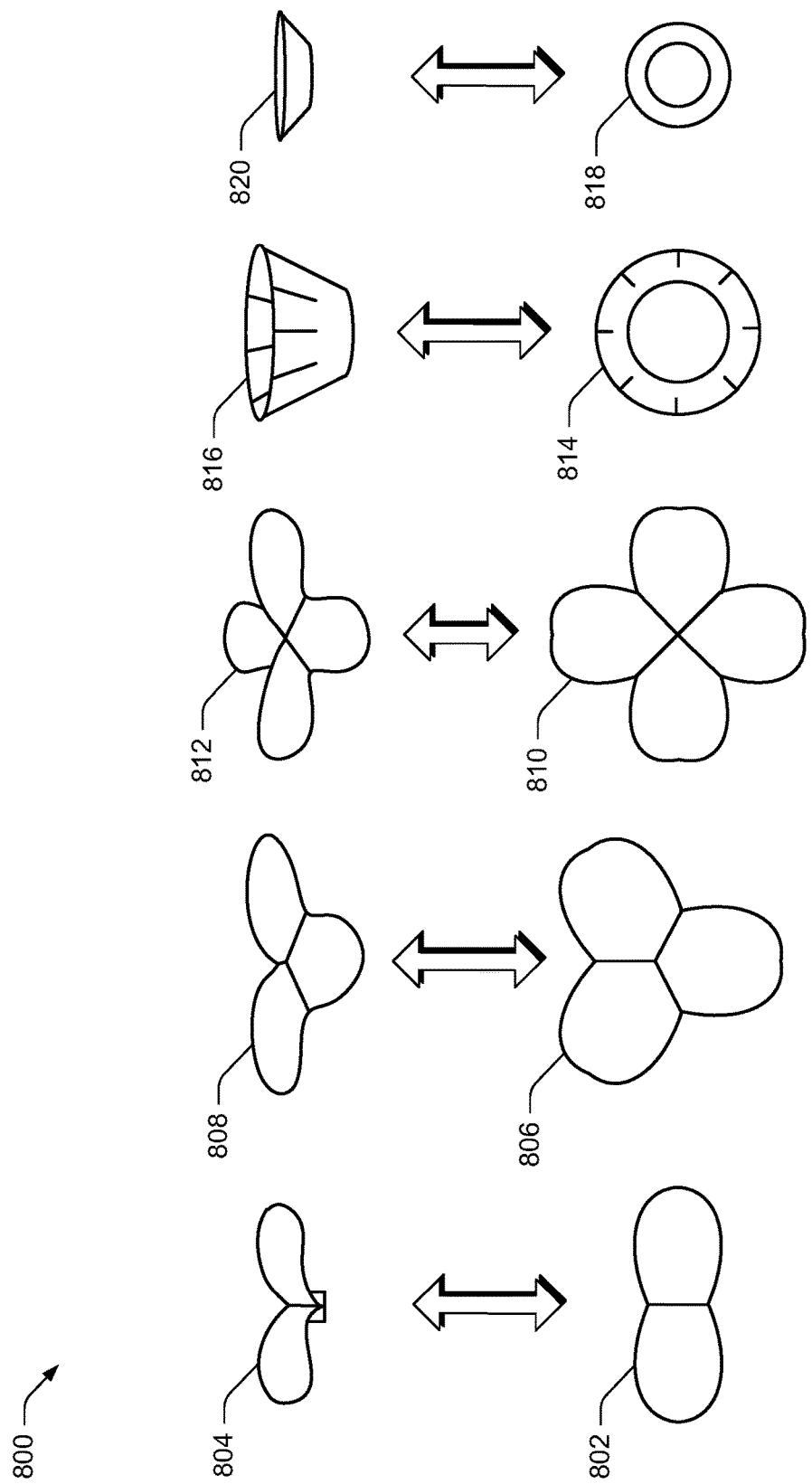
FIG. 8 is a diagram of additional examples of deformable contacts for making conductive contact between two surfaces.

FIG. 8 shows additional examples of deformable contacts 800 for making conductive contacts in electronic assembly processes. The example deformable contacts 800 are shown for the sake of illustrating that the deformable contacts 800 can have numerous different shapes. The shown set of example deformable contacts 800 is not meant to be limiting or exclusive. Dimensions of the example deformable contacts 800 shown in FIG. 8 are stylized for the sake illustrating differences in shape and function, and are not meant to limit the scale of the parts, dimensions, or features.

The shown examples of deformable contacts 800 can be implemented at different sizes. The deformable contacts 800 can be relatively large, or can be implemented on a micron scale, with some dimensions only a few microns in length, width, depth, height, or diameter.

In a top view, an example deformable contact 802 has two flexible, deformable leaves symmetrical across a line. During deformation, the two flexible leaves 804 can bend and spread apart to various degrees needed to form a compliant conductive contact with a target conductor that may be within a range of different distances from the example deformable contact 802. A plurality of the deformable contacts 802 on a single surface may each spread and open to different degrees to make respective conductive couplings.

In a top view, another example deformable contact 806 has three flexible, deformable leaves symmetrical about a point. During deformation, the three flexible leaves 808 can bend and spread apart from each other to various equal or unequal degrees needed to form a compliant conductive contact with a target conductor that may be at various distances from the example deformable contact 802, and may be at different distances from each leaf of the three-leaved deformable contact 806. A plurality of the deformable contacts 806 on a single surface may each spread and open to different degrees and to different shapes to make respective conductive couplings.

In a top view, another example deformable contact 810 has four flexible, deformable leaves symmetrical about a point, and across various lines. During deformation, the four flexible leaves 812 can bend and spread apart from each other to various equal or unequal degrees needed to form a compliant conductive contact with a target conductor that may be at various distances from the example deformable contact 810, and that may be at different distances from each leaf of the four-leaved deformable contact 810. A plurality of the deformable contacts 810 on a single surface may each spread and open to different degrees and to different shapes to make respective conductive couplings.

In a top view, another example deformable contact 814 has a truncated cone shape, with slits, divides, or serrations to provide compliant deformable members during deformation, such as compression. During deformation 816, the example deformable contact 814 can compliantly open and the members spread apart to form a compliant conductive contact with a target conductor that may be at various distances from the example deformable contact 814. A plurality of the deformable contacts 814 on a single surface may each spread and open to different degrees to make respective conductive couplings.

In a top view, another example deformable contact 818 has a shallow dish or cup shape, symmetrical about a center point. During deformation 820, the dish or cup shape of the example deformable contact 818 can open and enlarge to various degrees needed to form a compliant conductive contact with a target conductor that may be within a range of different distances from the example deformable contact 818. A plurality of the deformable contacts 818 on a single surface may each spread and open to different degrees to make respective conductive couplings.

Numerous other shapes and dimensions of the example deformable contacts 800 can be implemented within the scope of the described subject matter. For example, a given example deformable contact 800 may also have extra wings or appendages, as described further above.

Example Methods

Figure 9:
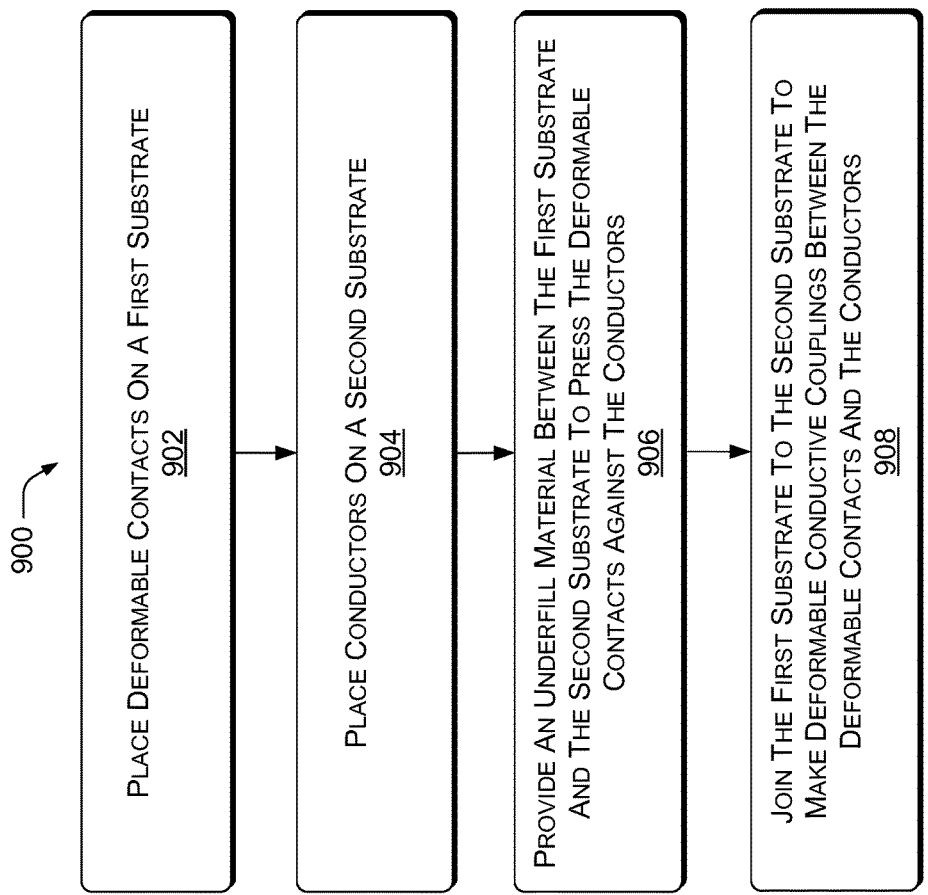
FIG. 9 is a flow diagram of an example method of electronic assembly with deformable conductive contacts.

FIG. 9 shows an example method 900 of making conductive connections while joining two surfaces with deformable conductive contacts. In the flow diagram of FIG. 9, operations of the example method 900 are shown in individual blocks.

At block 902, a plurality of deformable conductive contacts is placed on a first substrate. In an implementation, each deformable conductive contact of the plurality of deformable conductive contacts has a wiping feature or wiping member to clear films or debris present on the target conductor and to make positive metal-to-metal electrical contact.

At block 904, a plurality of conductors, such as conductive pads, is placed on a second substrate.

At block 906, an underfill material is provided between the first substrate and the second substrate to press the plurality of deformable conductive contacts against the plurality of conductive pads. In an implementation, the underfill material may comprise a dielectric, or a polymer. In an implementation, the underfill material is composed of a flowable material, or a combination of materials to make at least one solid layer and at least one flowable layer of material.

At block 908, the first substrate is joined to the second substrate, by an intermediating layer, for example. If a flowable underfill material is used, then the flowable underfill is allowed to cure, cool, and or harden, providing a solidly joined package with consistent electrical paths between the plurality of deformable contacts on the first substrate and the target conductive pads on the second substrate, now joined.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A system, comprising:
   a plurality of deformable contacts on a first substrate;
   a plurality of conductive pads on a second substrate;
   each deformable contact having a cupped shape and presenting a concave opening of the cupped shape to a corresponding conductive pad on the second substrate;
   each deformable contact to conductively couple with a corresponding conductive pad when the first substrate is joined to the second substrate;
   each deformable contact configured to expand the concave opening of the cupped shape in relation to a degree of compression against each corresponding conductive pad; and
   at least one underfill material underlying or underflowing each deformable contact to press each deformable contact against each corresponding conductive pad and to determine a closest proximity of the first substrate to the second substrate.

2. The system of claim 1, wherein each deformable contact further comprises at least a wiping surface for moving across a surface of the corresponding conductive pad while conductively coupling with the corresponding conductive pad.

3. The system of claim 1, wherein each deformable contact comprises a geometry capable of providing degrees of deformability to provide compliance for variations in proximity between each deformable contact of the plurality of deformable contacts and each corresponding conductive pad of the plurality of conductive pads.

4. The system of claim 1, wherein the at least one underfill material is selected from the group consisting of a first solid underfill material and a second flowable underfill material, a flowable dielectric, a solid dielectric, both a solid dielectric and a flowable dielectric, a mixture of solid and flowable polymers, and a thermoplastic polyimide.

5. The system of claim 1,
   wherein the at least one underfill material is initially disposed on the first surface, on the second surface, or on both the first surface and the second surface before the first substrate is joined to the second substrate; and
   wherein the at least one underfill material cools or hardens to permanently join the first substrate to the second substrate.

6. The system of claim 1, wherein each deformable contact comprises a conductive member selected from the group consisting of a a flexible cup, a truncated cone, a cloverleaf of conductive material, a v-shaped member, a v-shaped member with wings, a u-shaped member, and a y-shaped member.

7. A device, comprising:
   a cupped deformable electrical contact for making a conductive coupling between a first conductor of a first surface and a second conductor of a second surface when the first surface is brought into proximity with the second surface;
   each cupped deformable electrical contact having a cupped shape and presenting a concave opening of the cupped shape to a corresponding second conductor of the second surface; and
   a wiping surface of the cupped deformable electrical contact configured to move across the second conductor when making the conductive coupling.

8. The device of claim 7, further comprising one or more layers of at least one underfill material underlying or underflowing each cupped deformable electrical contact to fill at least a part of a space between the first surface and the second surface;
   wherein the one of more layers of at least one underfill material further comprise a polymer material or dielectric to provide a supporting force to the wiping surface when moving across the second conductor; and
   wherein the polymer material or the dielectric determines a degree of maximum movement of the wiping surface.

9. The device of claim 8, wherein at least a layer of the one of more layers of the at least one underfill material is flowable during a joining of the first surface and the second surface; and
   wherein the at least one underfill material that is flowable completely fills the concave opening of the cupped shape of each cupped deformable electrical contact when the joining of the first surface and the second surface is complete.

10. The device of claim 7, wherein the cupped deformable electrical contact comprises a conductive member selected from the group consisting of a cloverleaf of conductive material, a flexible cup, a truncated cone, a v-shaped member, a v-shaped member with wings, a u-shaped member, and a y-shaped member.

11. The device of claim 7, wherein the cupped deformable electrical contact has a geometry to deform in a direction of the joining and expands or spreads open in one or more directions perpendicular to the direction of the joining to perform a wiping of the second conductor.

12. The device of claim 7, wherein the wiping surface is configured to clear a nonconductive film on the second conductor during a wiping of the second conductor to make the conductive coupling.

13. The device of claim 7, wherein a pressure between the first surface and the second surface during the joining causes the cupped deformable electrical contact to weld to the second conductor, wherein the weld between the cupped deformable electrical contact and the second conductor comprises a thermocompression bond, a diffusion bond, or a metal-to-metal bond.

14. The device of claim 7, wherein the cupped deformable electrical contact is capable of annealing or sintering to the second conductor at a raised temperature or upon an application of ultrasound, or both at the raised temperature and upon the application of ultrasound, during the joining.

15. The device of claim 7, wherein the cupped deformable electrical contact further comprises at least one wing, to maintain a constant amount of surface area contact with the second conductor while the cupped deformable electrical contact deforms against the second conductor.

16. The device of claim 15, wherein the at least one wing provides an increased area of surface area contact in addition to the surface area contact of the cupped deformable electrical contact, the increased area capable of making contact with the second conductor when the cupped deformable electrical contact is misaligned with respect to the second conductor.

17. The device of claim 7, further comprising at least one layer of solder on the cupped deformable electrical contact to secure the conductive coupling.

18. The device of claim 7, further comprising a protective film or a layer of an oxidation protector on the cupped deformable electrical contact.

19. A method, comprising:
   placing a plurality of deformable conductive contacts on a first substrate;
   placing a plurality of conductors on a second substrate;

providing an underfill material underlying or underflowing the plurality of deformable conductive contacts to deform the plurality of deformable conductive contacts against the plurality of conductors;

joining the first substrate to the second substrate to conductively couple the deformable conductive contacts with the plurality of conductors of the second substrate; and flowing the underfill material to fill all open spaces between non-contacting parts of the plurality of deformable conductive contacts and the second substrate.

20. The method of claim 19, further comprising providing a wiping feature for each deformable conductive contact; and wherein providing the underfill material further comprises providing a mixture of at least one solid layer of a polymer and at least one flowable layer of a polymer to press the wiping features into the conductors at a given pressure.

* * * * *